US012628518B2

(12) United States Patent
Kwak et al.

(10) Patent No.: US 12,628,518 B2
(45) Date of Patent: May 12, 2026

(54) DRIVER CONNECTION LINE HAVING MULTIPLE RESISTIVITIES AND DISPLAY DEVICE HAVING THE SAME

(71) Applicant: Samsung Display Co., LTD., Yongin-si (KR)

(72) Inventors: Minchae Kwak, Seoul (KR); Byungsun Kim, Hwaseong-si (KR); Kyeonghwa Kim, Asan-si (KR); Mihae Kim, Asan-si (KR); Kyonghwan Oh, Seoul (KR); Sumi Jang, Asan-si (KR); Seunghan Jo, Seoul (KR); Jae-Ho Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 525 days.

(21) Appl. No.: 17/689,317

(22) Filed: Mar. 8, 2022

(65) Prior Publication Data

US 2022/0367601 A1    Nov. 17, 2022

(30) Foreign Application Priority Data

May 11, 2021    (KR) ......................... 10-2021-0060835

(51) Int. Cl.
| | |
|---|---|
| *H10K 59/131* | (2023.01) |
| *H01L 25/18* | (2023.01) |
| *H10K 77/10* | (2023.01) |

(52) U.S. Cl.
CPC .......... *H10K 59/1315* (2023.02); *H01L 25/18* (2013.01); *H10K 77/10* (2023.02)

(58) Field of Classification Search
CPC ........................... H10K 59/1315; H10K 77/10
See application file for complete search history.

(56) References Cited

U.S. PATENT DOCUMENTS

| | | | |
|---|---|---|---|
| 2004/0125258 A1* | 7/2004 | Moon | ................. G02F 1/13452 |
| | | | 349/43 |
| 2009/0102758 A1 | 4/2009 | Anzai et al. | |

(Continued)

FOREIGN PATENT DOCUMENTS

| | | |
|---|---|---|
| JP | 2009122636 A | 6/2009 |
| KR | 10-1627245 B1 | 6/2016 |

(Continued)

OTHER PUBLICATIONS

European Search Report for European Patent Application No. 22172262.2 dated Oct. 5, 2022.

(Continued)

*Primary Examiner* — Norman D Richards
*Assistant Examiner* — Sean Ayers Winters
(74) *Attorney, Agent, or Firm* — CANTOR COLBURN LLP

(57) ABSTRACT

A display device includes a display area having a curved outer edge, a non-display area extended along the curved outer edge of the display area, the non-display area including a driver, a first non-display area including a first fan-out line having a first resistivity value; and a second non-display area extended along the curved outer edge of the display area and in a direction away from the first non-display area, the second non-display area including a first connection line which connects the driver to the first fan-out line, the first connection line having a second resistivity value less than the first resistivity value of the first fan-out line.

24 Claims, 7 Drawing Sheets

(56)         References Cited

U.S. PATENT DOCUMENTS

| | | | | |
|---|---|---|---|---|
| 2015/0187321 A1* | 7/2015 | Kim | ..................... | G09G 3/3666 |
| | | | | 345/87 |
| 2016/0232837 A1* | 8/2016 | Lee | ..................... | G09G 3/3275 |
| 2016/0300863 A1 | 10/2016 | Koide et al. | | |
| 2016/0343980 A1* | 11/2016 | Lee | .................... | H10K 50/8426 |
| 2018/0040683 A1* | 2/2018 | Matsueda | ............. | H10K 50/84 |
| 2019/0391454 A1 | 12/2019 | Koide et al. | | |
| 2019/0393294 A1* | 12/2019 | Song | ................. | H01L 27/1222 |
| 2020/0006397 A1* | 1/2020 | Park | .................... | H01L 27/1244 |
| 2021/0036087 A1 | 2/2021 | Kwak et al. | | |

FOREIGN PATENT DOCUMENTS

| | | |
|---|---|---|
| KR | 20160082883 A | 7/2016 |
| KR | 1020190038718 A | 4/2019 |
| KR | 1020190090417 A | 8/2019 |
| KR | 1020200010697 A | 1/2020 |

OTHER PUBLICATIONS

European Search Report for European Patent Application No. 25218030.2 dated Mar. 9, 2026.

* cited by examiner

10

NDA

DA

NDA2

PX

SDR

DDR

CL

A

B

FOL

IC

NDA1

CNT4

CL1-1
ILD
FOL2
GI2
GI1
BFR
BRR
PI

SUB { BRR, PI }

III  III'

CNT6

CL2-1
VIA
CP
ILD

CNT5

GI2
FOL1
GI1
BFR
BRR
PI

SUB { BRR, PI }

IV  IV'

DRIVER CONNECTION LINE HAVING MULTIPLE RESISTIVITIES AND DISPLAY DEVICE HAVING THE SAME

This application claims priority to Korean Patent Application No. 10-2021-0060835 filed on May 11, 2021, and all the benefits accruing therefrom under 35 U.S.C. § 119, the entire disclosure of which is incorporated by reference herein.

BACKGROUND

1. Field

Embodiments relate to an electronic device such as a display device.

2. Description of the Related Art

An electronic device such as a display device is a device that displays an image for providing visual information to outside the electronic device. Among display devices, an organic light emitting diode display has attracted attention.

The display device may generally include a display substrate having a square shape. The display device may include a display area and a non-display area which is adjacent to the display area. A plurality of pixels for displaying an image and signal lines for transmitting signals to the pixels may be formed in the display area. A driver for driving the pixels, a signal generating chip, and conductive lines for connecting the driver and the signal generating chip may be formed in the non-display area.

SUMMARY

A demand for an electronic device such as a display device having a non-square shape is increasing. Since the non-square display device has a pixel arrangement different from that of a conventional display device, lengths of the conductive lines in a non-display area of the display device may be long. Accordingly, there is a problem in that an electrical resistance of the conductive lines increases and a width of the conductive lines increases in order to secure a sufficient scan-on time.

Embodiments provide an electronic device such as a display device with improved display quality.

A display device includes a substrate including a display area having a non-square shape and a non-display area including a first non-display area surrounding a portion of the display area and a second non-display area surrounding a remaining portion of the display area, a first fan-out line in the first non-display area on the substrate, and having a first resistivity value, a first connection line in a portion of the first non-display area and the second non-display area on the first fan-out line, connected to the first fan-out line through a first contact hole, and having a second resistivity value less than the first resistivity value and a driver in the non-display area and connected to the first connection line.

In an embodiment, the first fan-out line may include molybdenum ("Mo"), and the first connection line may include aluminum ("Al") and titanium ("Ti").

In an embodiment, the display device may further include an insulation layer on the first fan-out line, and the first contact hole may be in the insulation layer.

In an embodiment, the first connection line may include a first portion overlapping the first fan-out line and a second portion excluding the first portion.

In an embodiment, the first fan-out line may be in the first non-display area, the first portion of the first connection line may be in the first non-display area, and the second portion of the first connection line may be in the second non-display area.

In an embodiment, the display device may further include a second fan-out line spaced apart from the first fan-out line on a surface of the substrate and having a third resistivity value, and a second connection line spaced apart from the first connection line, electrically connected to the second fan-out line, having a fourth resistivity value less than the third resistivity value, and connected to the driver.

In an embodiment, the first fan-out line may include a plurality of first fan-out lines, the second fan-out line may include a plurality of second fan-out lines, and the first and the second fan-out lines may alternate on the surface of the substrate.

In an embodiment, the first connection line may include a plurality of first connection lines, the second connection line may include a plurality of second connection lines, and the first and second connection lines may alternate on the surface of the substrate.

In an embodiment, the display device may further include a connection pattern on a same layer as the first connection line, and overlapping the second fan-out line and the second connection line.

In an embodiment, the second fan-out line may be connected to the connection pattern through a second contact hole, and the connection pattern may be connected to the second connection line through a third contact hole.

In an embodiment, the display device may further include a first insulation layer on the second fan-out line and a second insulation layer on the first connection line, the second contact hole may be in the first insulation layer, and the third contact hole may be in the second insulation layer.

In an embodiment, the second connection line may include a first portion overlapping the second fan-out line and a second portion excluding the first portion.

In an embodiment, the second fan-out line may be in the first non-display area, the first portion of the second connection line may be in the first non-display area, and the second portion of the second connection line may be in the second non-display area.

In an embodiment, the first contact hole and the second contact hole may be staggered from each other in a zigzag pattern on the surface of the substrate.

In an embodiment, the display device may further include a signal generating chip in the non-display area and connected to the first fan-out line and the second fan-out line.

In an embodiment, the first fan-out line and the second fan-out line may be on different layers, and the first connection line and the second connection line may be on different layers.

In an embodiment, the driver may include scan circuits and demultiplexers, and the scan circuits and the demultiplexers may alternate in the non-display area.

In an embodiment, the demultiplexer may be connected to at least one of the first connection line and the second connection line.

A display device includes a substrate including a display area having a non-square shape and a non-display area including a first non-display area surrounding a portion of the display area and a second non-display area surrounding a remaining portion of the display area, a first fan-out line in the first non-display area on the substrate and having a first resistivity value, a second fan-out line in the first non-display area on the first fan-out line, spaced apart from the first fan-out line on a surface of the substrate, and having a second resistivity value, a first connection line in a portion of the first non-display area and the second non-display area on the second fan-out line, connected to the second fan-out line through a fourth contact hole, and having a third resistivity value less than the second resistivity value, a second connection line in a portion of the first non-display area and the second non-display area on the first connection line, spaced apart from the first connection line on a surface of the substrate, connected to the first fan-out line, and having a fourth resistivity value less than the first resistivity value and a driver in the non-display area and connected to the first connection line and the second connection line.

In an embodiment, the first fan-out line and the second fan-out line may include molybdenum ("Mo"), and the first connection line and the second connection line may include aluminum (Al) and titanium ("Ti").

In an embodiment, the first fan-out line and the second fan-out line may be on different layers, the first connection line and the second connection line may be on different layers, the first fan-out line may include a plurality of first fan-out lines, the second fan-out line may include a plurality of second fan-out lines, the first and the second fan-out lines may alternate on the surface of the substrate, the first connection line may include a plurality of first connection lines, the second connection line may include a plurality of second connection lines, and the first and second connection lines may alternate on the surface of the substrate.

In an embodiment, the display device may further include an insulation layer between the second fan-out line and the first connection line, and the fourth contact hole may be in the insulation layer.

In an embodiment, the display device may further include a connection pattern on a same layer as the first connection line, spaced apart from the first connection line, and overlapping the first fan-out line and the second connection line.

In an embodiment, the first fan-out line and the connection pattern may be connected through a fifth contact hole, and the connection pattern and the second connection line may be connected through a sixth contact hole.

In an embodiment, the display device may further include a first insulation layer on the second fan-out line and below the first connection line, a second insulation layer between the first connection line and the second connection line and a third insulation layer on the first fan-out line and below the second fan-out line.

In an embodiment, the fifth contact hole may be in the first insulation layer and the third insulation layer, and the sixth contact hole may be in the second insulation layer.

In a display device, a first fan-out line and a second fan-out line in the non-display area and connected to the signal generating chip may be connected to the driver and may be connected to the first and second connection lines having relatively small resistivity values. Accordingly, line resistance due to lines connecting the signal generating chip and the driver may be reduced. As the resistance is reduced, a sufficient scan on time may be secured, and image quality deterioration due to unevenness and crosstalk of the display device may be improved.

In addition, since a sufficient scan-on time may be secured, a minimum width of the lines required to secure the scan on time may be relatively reduced. Accordingly, an area of the non-display area of the display device may be reduced.

BRIEF DESCRIPTION OF THE DRAWINGS

The above and other advantages and features of this disclosure will become more apparent by describing in

Figure 1:
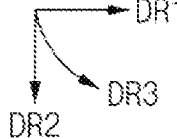

4 further detail embodiments thereof with reference to the accompanying drawings, in which:

FIG. 1 is a plan view illustrating an embodiment of a display device.

Figure 2:
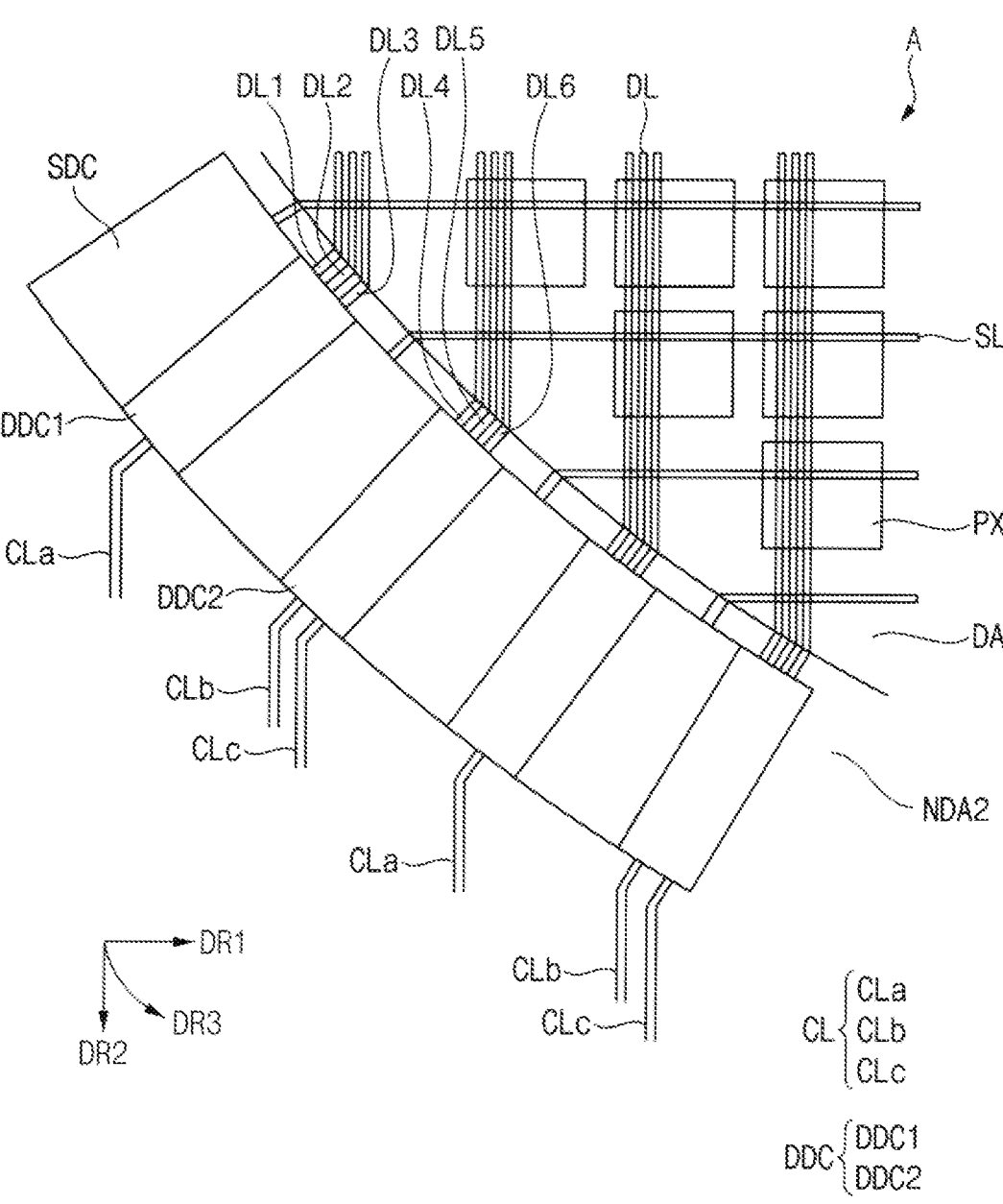

FIG. 2 is an enlarged plan view of an area A of FIG. 1.

Figure 3:
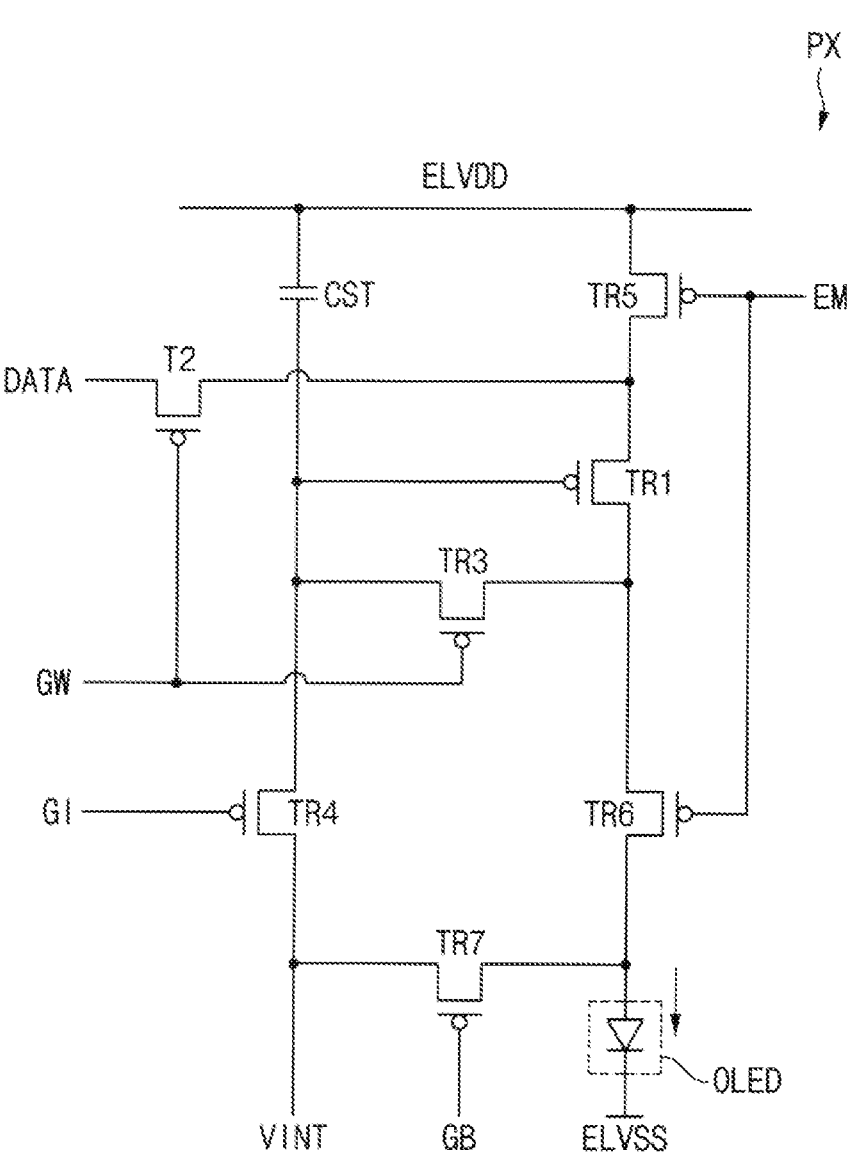

FIG. 3 is a circuit diagram illustrating an embodiment of a pixel included in the display device of FIG. 1.

Figure 4:
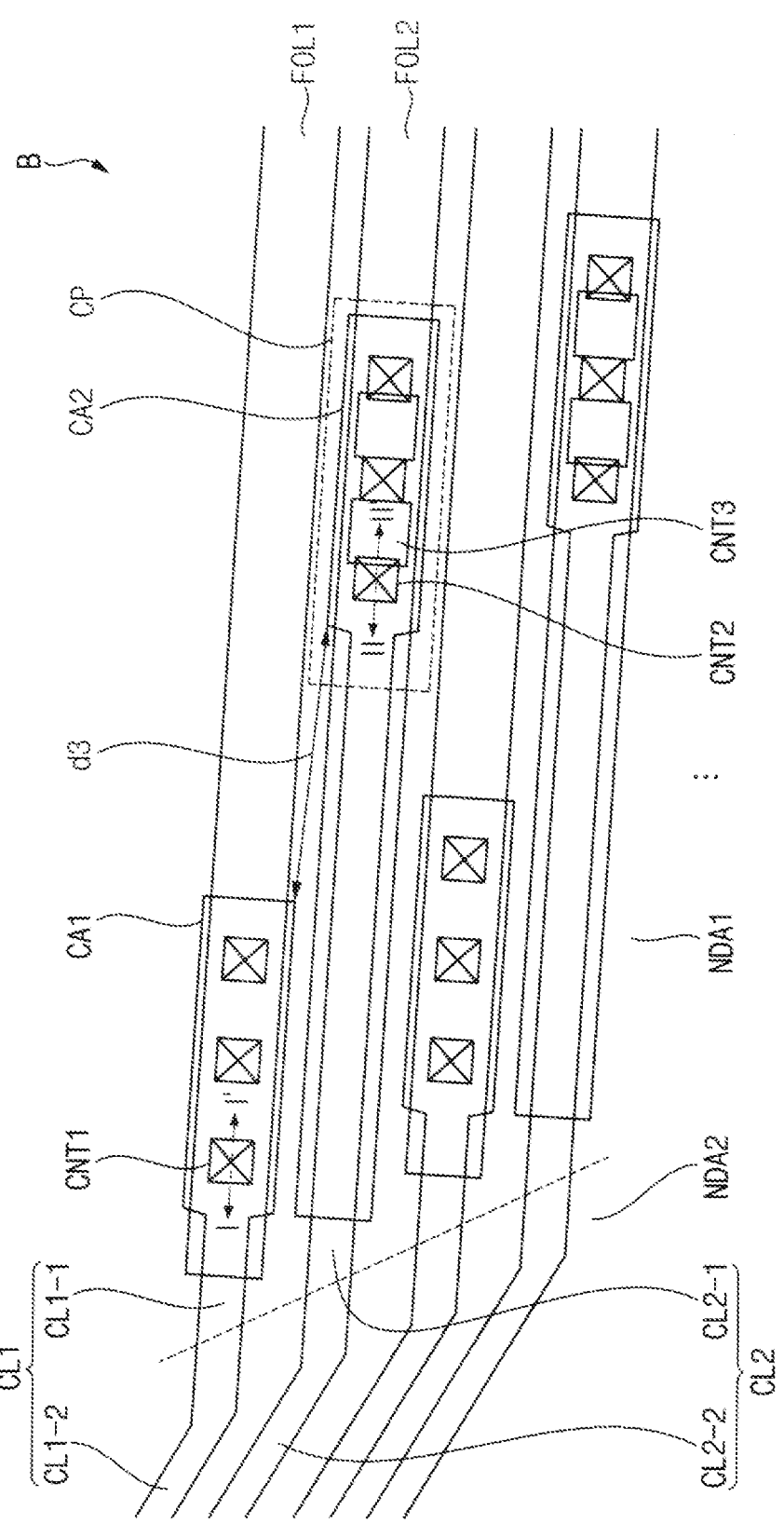

FIG. 4 is an enlarged view of an area B of FIG. 1.

Figure 5:
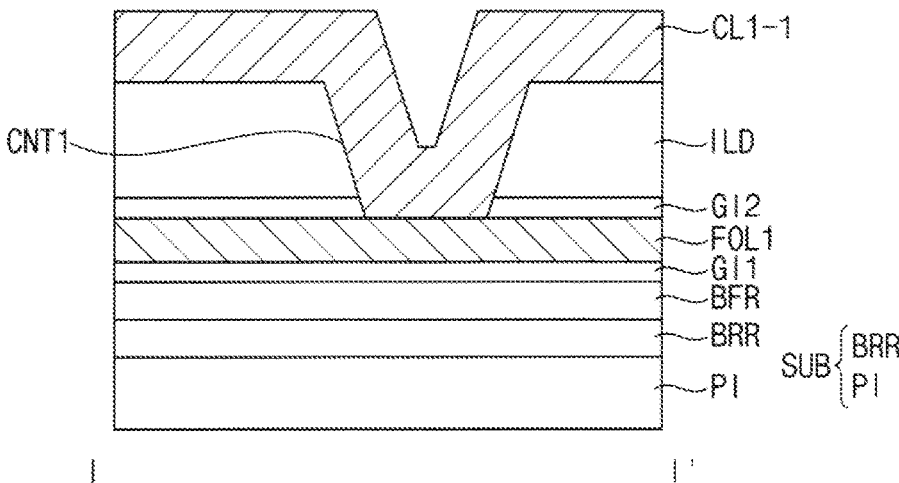

FIG. 5 is a cross-sectional view taken along line I-I' of FIG. 4.

Figure 6:
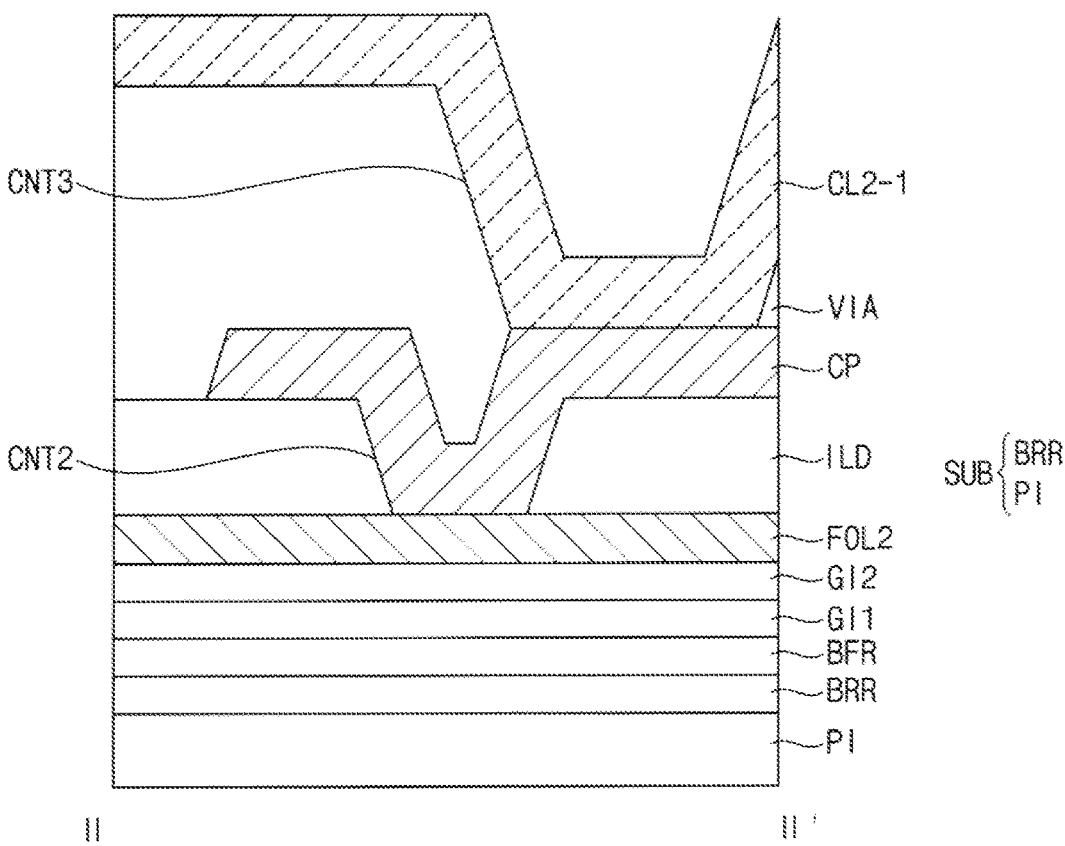

FIG. 6 is a cross-sectional view taken along line II-II' of FIG. 4.

Figure 7:
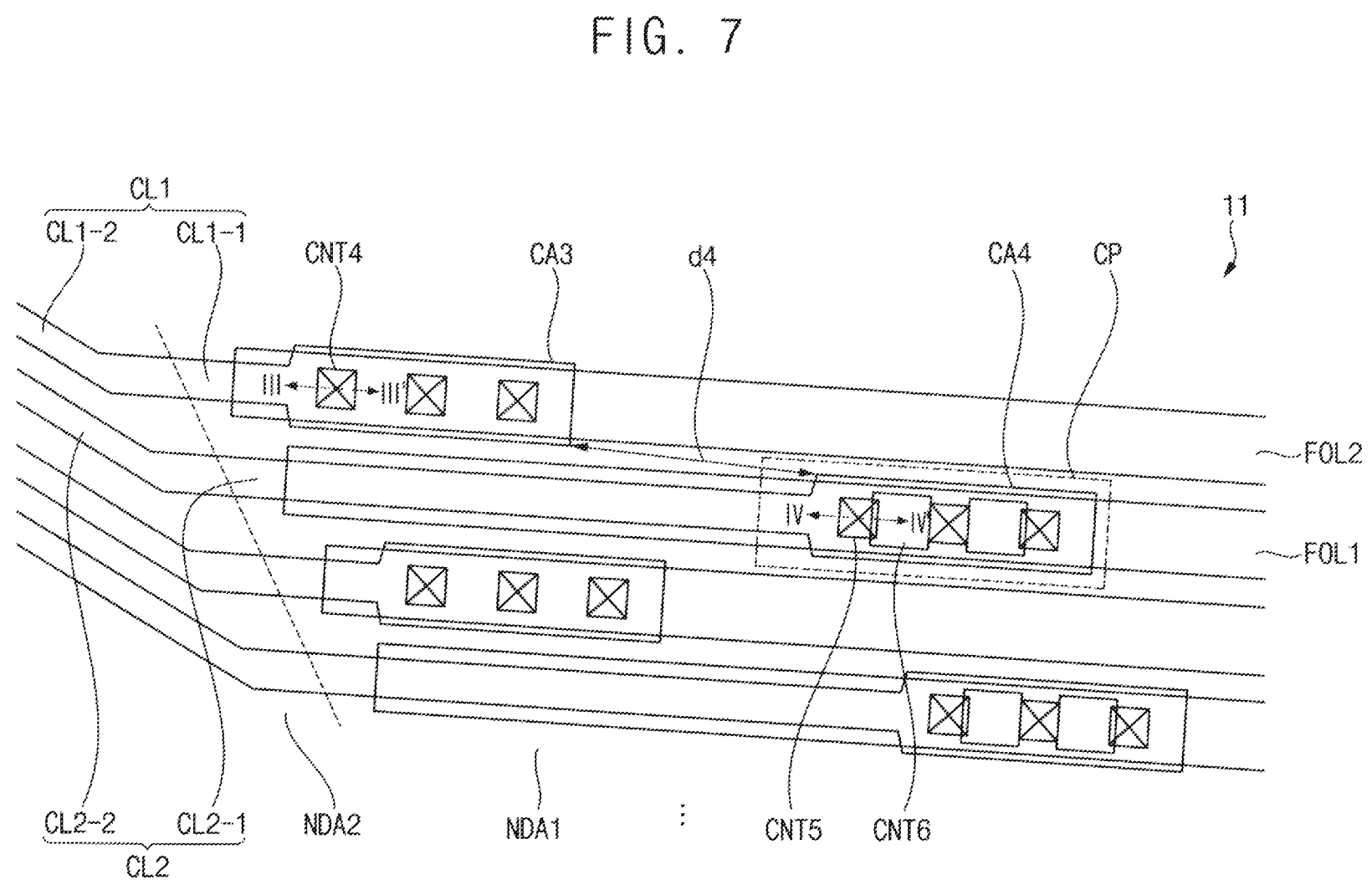

FIG. 7 is an enlarged plan view of an embodiment of the display device of FIG. 1.

Figure 8:
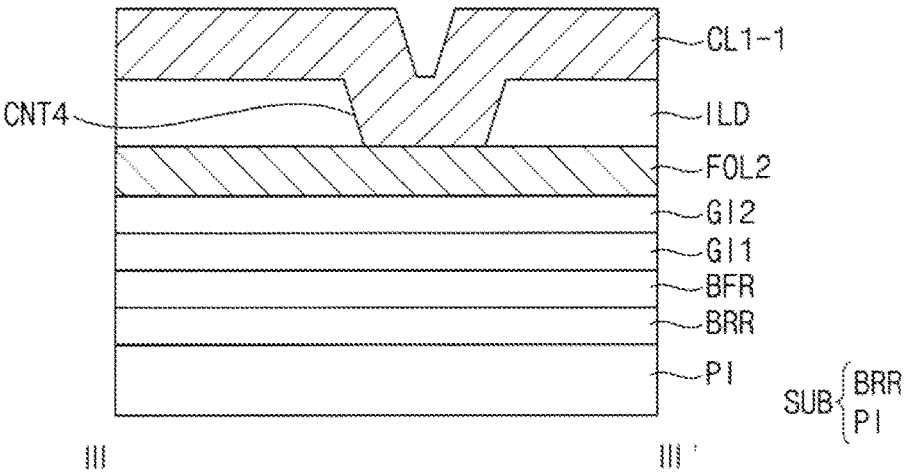

FIG. 8 is a cross-sectional view taken along line of III-III' FIG. 7.

Figure 9:
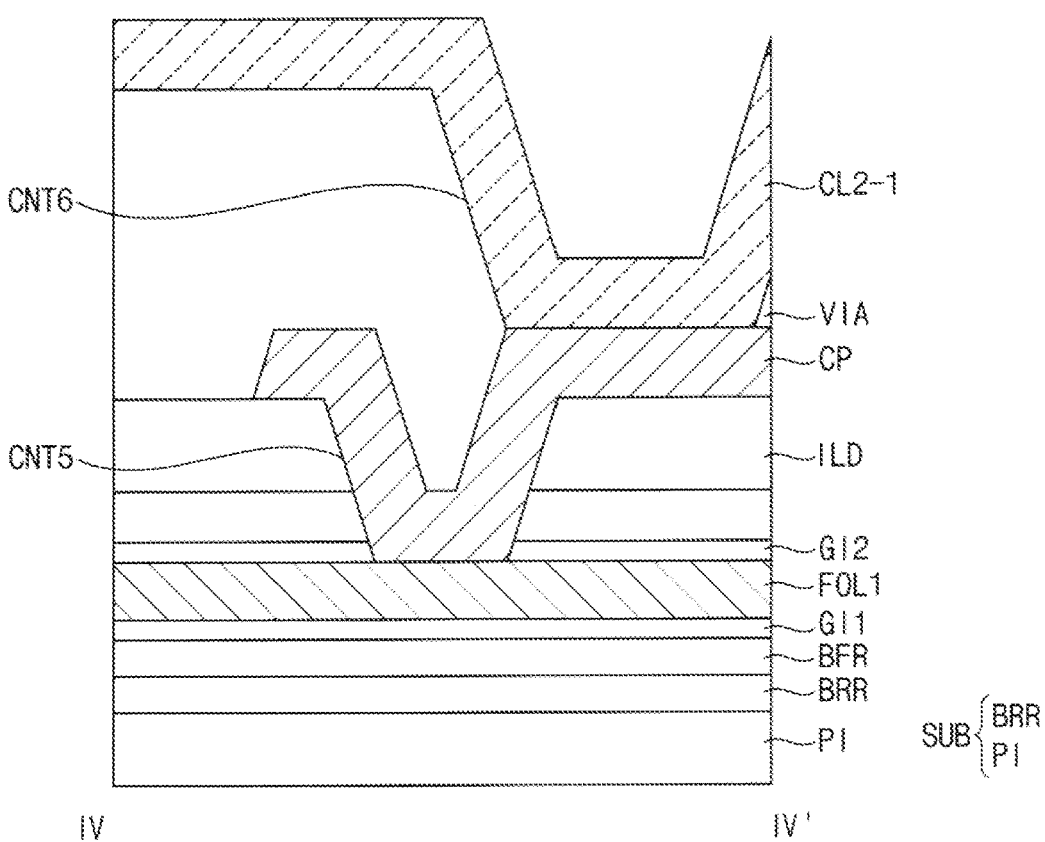

FIG. 9 is a cross-sectional view taken along line IV-IV' of FIG. 7.

DETAILED DESCRIPTION

Hereinafter, embodiments of the invention will be described in more detail with reference to the accompanying drawings. The same reference numerals are used for the same components in the drawings, and redundant descriptions of the same components will be omitted. As used herein, a reference number may indicate a singular element or a plurality of the element. For example, a reference number labeling a singular form of an element within the drawing figures may be used to reference a plurality of the singular element within the text of the specification.

It will be understood that when an element is referred to as being related to another element such as being "on" another element, it can be directly on the other element or intervening elements may be present therebetween. In contrast, when an element is referred to as being related to another element such as "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is a plan view illustrating an embodiment of a display device 10. FIG. 2 is an enlarged plan view of area A of FIG. 1.

Referring to FIGS. 1 and 2, a display device 10 may include a display area DA and a non-display area NDA which is adjacent to the display area DA. In an embodiment, the non-display area NDA may surround the display area DA. In an embodiment, the display area DA and the non-display area NDA may have a same shape. That is, a shape of the non-display area NDA may correspond to a shape of the display area DA. Each of the display area DA and the non-display area NDA may have a non-square shape (e.g., a non-linear shape such as a curved shape). In an embodiment, for example, the display area DA may have various non-square shapes, such as a circular shape, an elliptical shape, or a partially curved polygon. In an embodiment, as shown in FIG. 1, both the display area DA and the non-display area NDA may have circular shapes.

A pixel PX provided in plural including a plurality of pixels PX may be disposed in the display area DA. Each of the pixels PX may include a plurality of sub-pixels. In an embodiment, for example, each of the pixels PX may include three sub-pixels respectively emitting red, green, and blue light. However, embodiments are not limited thereto. Each of the pixels PX may include two sub-pixels or four or more sub-pixels.

In an embodiment, the pixels PX may be arranged in various ways in the display area DA. In an embodiment, for example, the pixels PX may be arranged in a matrix form along a first direction DR1 and a second direction DR2 crossing the first direction DR1. In an embodiment, the second direction DR2 may be substantially perpendicular to the first direction DR1. The display device 10 and various components or layers thereof may be in a plane defined by the first direction DR1 and the second direction DR2 which cross each other. A thickness direction of the display device 10 and various components or layers thereof may cross the above-described plane, without being limited thereto.

The display area DA may include an outer edge which is curved to have a curvature (e.g., a curved outer edge). The pixels PX may be disposed in a stepwise manner along a curvature of the display area DA at an edge of the display area DA. That is, the pixels PX may be arranged along the edge of the display area DA. A number of pixels PX included in a row and column arrangement of the pixels PX may be different for each row and for each column. Accordingly, the row and column arrangement of the pixels PX may include a step-shaped step difference. Accordingly, the display device 10 may display an image in the display area DA which has the non-linear shape, as a whole.

The pixels PX may be electrically connected to a signal line such as a scan line SL extending along the first direction DR1 and a signal line such as a data line DL extending along the second direction DR2. The scan line SL and the data line DL may cross each other and may respectively be a signal line among a plurality of signal lines of the display device 10. The scan line SL and/or the data line DL may be in the display area DA and extend from the display area DA into the non-display area NDA, without being limited thereto. That is, the scan line SL and/or the data line DL may include portions in the display area DA and in the non-display area NDA.

In an embodiment, various components for driving the pixels PX may be disposed in the non-display area NDA. In an embodiment, for example, a plurality of drivers and a signal generating chip IC which transmit signals to the drivers may be disposed in the non-display area NDA. The drivers may include a demultiplexer unit DDR and a scan driver SDR.

The scan driver SDR may sequentially provide electrical signals such as scanning signals to the pixels PX. The demultiplexer unit DDR may provide electrical signals such as data signals to the pixels PX. The scan driver SDR may include a scan circuit SDC provided in plural including a plurality of scan circuits SDC. The demultiplexer unit DDR may include a plurality of demultiplexers DDC. Each of the scanning signals and the data signals may respectively be an electrical signal among the electrical signals.

The scan circuit SDC may be disposed in the non-display area NDA. The scan circuit SDC may be directly connected to the scan line SL of the display area DA. Optionally, the scan circuit SDC may be connected to the scan line SL of the display area DA by a scan connection line disposed in the non-display area NDA. The scan connection line may include connection lines of different material layers together with each other. That is, a portion of the scan connection line may be formed on a same layer as the first fan-out line FOL1 or a same layer as the second fan-out line FOL2 (of FIG. 4). The remaining portion of the scan connection line may be formed on a same layer as the second connection line CL2 (of FIG. 4), and may be connected to a portion of the connection line. As used herein, elements being on a same layer may describe elements being respective patterns of a same material layer among materials layers arranged along the thickness direction of the display device 10 (e.g., in a same layer), without being limited thereto. However, embodiments are not limited thereto.

The plurality of demultiplexers DDC may be disposed in the non-display area NDA. The plurality of demultiplexers DDC may be directly connected to the data line DL of the display area DA. Optionally, the demultiplexers DDC may be connected to the data line DL of the display area DA by a data connection line disposed in the non-display area NDA.

A boundary line between the display area DA and the non-display area NDA may have a curved shape and may be a curved line. Accordingly, a portion of the boundary line may have an arc shape corresponding to the curved outer edge of the display area DA. An arc direction DR3 may correspond to the boundary line, and the scan circuits SDC and the demultiplexers DDC may be arranged within the non-display area NDA along the arc direction DR3. In an embodiment, for example, the scan circuits SDC and the demultiplexeres DDC may be alternately disposed along the arc direction DR3 within the non-display area NDA.

The signal generating chip IC may be disposed in the non-display area NDA. The signal generating chip IC may provide the data signals to the pixels PX through the fan-out lines FOL and the connection lines CL. The fan-out lines FOL and the connection lines CL may be in order in a direction toward a driver, without be limited thereto.

The fan-out lines FOL may be disposed in the non-display area NDA. Each of the fan-out lines FOL may be connected to the signal generating chip IC to receive the data signals therefrom.

The connection lines CL may be disposed in the non-display area NDA. The fan-out line FOL may be connected to the connection line CL, and the connection line CL may receive the data signals from the fan-out line FOL.

Each of the connection lines CL may be respectively connected to one of the demultiplexers DDC. Each of the connection lines CL may provide the data signals to the demultiplexers DDC.

In an embodiment, for example, the connection lines CL may include a first sub-connection line CLa, a second sub-connection line CLb, and a third sub-connection line CLc. The demultiplexers DDC may include a first demultiplexer DDC1 and a second demultiplexer DDC2. Each of the first demultiplexer DDC1 and the second demultiplexer DDC2 may include first to third demultiplexer lines.

The data lines DL may include first to sixth data lines DL1, DL2, DL3, DL4, DL5, and DL6. The first to sixth data lines DL1, DL2, DL3, DL4, DL5, and DL6 may extend in or along the column direction and may be connected to the pixels PX arranged in the column direction. Specifically, the first to third data lines DL1, DL2, and DL3 may be connected to the pixels PX arranged in a same one pixel column. The fourth to sixth data lines DL4, DL5, and DL6 may be connected to the pixels PX arranged in a same next column among the pixel columns which is adjacent to the same on pixel column.

The first sub-connection line CLa may be connected to the first demultiplexer line included in the first demultiplexer DDC1. The first demultiplexer line included in the first demultiplexer DDC1 and the first demultiplexer line included in the second demultiplexer DDC2 may be connected to each other by a first bridge. Accordingly, a first data signal provided to the first sub-connection line CLa may be provided to both the first demultiplexer DDC1 and the second demultiplexer DDC2 via a same sub-connection line. The first demultiplexer line included in the first demultiplexer DDC1 may be connected to the first data line DL1 of the display area DA, and the first demultiplexer line included in the second demultiplexer DDC2 may be connected to the fourth data line DL4.

The second sub-connection line CLb may be connected to the second demultiplexer line included in the second demultiplexer DDC2. The second demultiplexer line included in the second demultiplexer DDC2 and the second demultiplexer line included in the first demultiplexer DDC1 may be connected to each other by a second bridge. The second bridge may be spaced apart from the first bridge. Accordingly, a second data signal provided to the second sub-connection line CLb may be provided to both the first demultiplexer DDC1 and the second demultiplexer DDC2 via a same sub-connection line. The second demultiplexer line included in the first demultiplexer DDC1 may be connected to the second data line DL2 of the display area DA, and the second demultiplexer line included in the second demultiplexer DDC2 may be connected to the fifth data line DL5.

The third sub-connection line CLc may be connected to the third demultiplexer line included in the second demultiplexer DDC2. The third demultiplexer line included in the second demultiplexer DDC2 and the third demultiplexer line included in the first demultiplexer DDC1 may be connected to each other by a third bridge. The third bridge may be spaced apart from the first bridge and the second bridge. Accordingly, a third data signal provided to the third sub-connection line CLc may be provided to both the first demultiplexer DDC1 and the second demultiplexer DDC2 via a same sub-connection line. The third demultiplexer line included in the first demultiplexer DDC1 may be connected to the third data line DL3 of the display area DA, and the third demultiplexer line included in the second demultiplexer DDC2 may be connected to the sixth data line DL6.

That is, an input terminal of a same one of the first demultiplexer DDC1 may be connected to a same one of the sub-connection line CLa. An output terminal of the same one of the first demultiplexer DDC1 may be connected to each of three data lines DL1, DL2, and DL3 (e.g., different data lines). Similarly, an input terminal of a same one of the second demultiplexer DDC2 may be connected to each of two sub-connection lines CLb and CLc (e.g., different sub-connection lines), and an output terminal of the same one of the second demultiplexer DDC2 may be connected to each of three data lines DL4, DL5, and DL6 (e.g., different data lines).

However, embodiments are not limited thereto. In an embodiment, one of the sub-connection lines CL may be electrically connected to at least three of the demultiplexers DDC through bridges connecting the various demultiplexer lines to each other.

Also, in an embodiment, the sub-connection lines CL may be directly connected to the data line DL of the display area DA without passing through the demultiplexeres DDC.

The connection lines CL and the fan-out lines FOL will be described in more detail with reference to FIGS. 4 to 6.

In an embodiment, the demultiplexeres DDC may be disposed only in a portion of the non-display area NDA. Lighting circuits may be disposed in a remaining portion of the non-display area NDA. In an embodiment, for, in an area adjacent to the signal generating chip IC among areas within the non-display area NDA (e.g., first area of the non-display area NDA which is closest to the signal generating chip IC), the demultiplexers DDC and the scan circuits SDC may be alternately disposed. Also, in the non-display area NDA that is not adjacent to the signal generating chip IC among areas within the non-display area NDA (e.g., second area of the non-display area NDA which is further from the signal generating chip IC than the first area), the scan circuits SDC and the lighting circuits may be alternately disposed.

FIG. 3 is a circuit diagram illustrating an embodiment of a pixel PX included in the display device 10 of FIG. 1.

FIGS. 1 to 3, each of the pixels PX may include at least one transistor and at least one capacitor. In an embodiment, for example, as illustrated in FIG. 3, each of the pixels PX may include seven transistors TR1, TR2, TR3, TR4, TR5, TR6, TR7 and one capacitor CST. However, this is only an example, and the number of transistors and the number of capacitors which each of the pixels PX may include is not limited thereto.

A plurality of electrical signals may be transmitted from the drivers to each of the pixels PX. In an embodiment, for example, a data signal DATA, a plurality of scan signals GW, GI, and GB, and an emission control signal EM may be transmitted as electrical signals to each of the pixels PX. Also, a high power voltage ELVDD, a low power voltage ELVSS and an initialization voltage VINT may be applied to each of the pixels PX. The pixels PX may operate a light emitting device OLED connected to the pixels PX based on the electrical signals.

In an embodiment, the pixels PX may be connected to the light emitting device OLED. In an embodiment, for example, the pixels PX may be connected to an organic light emitting diode as the light emitting device OLED. The light emitting device OLED may receive a signal (e.g., an electrical signal) from the pixels PX and may emit light. Accordingly, the display device 10 may display an image in the display area DA by the emitted light.

FIG. 4 is an enlarged plan view of area B of FIG. 1. FIG. 5 is a cross-sectional view taken along line I-I' of FIG. 4. FIG. 6 is a cross-sectional view taken along line II-II' of FIG. 4.

Referring to FIGS. 1 to 4, in an embodiment, the non-display area NDA of the display device 10 may include a first non-display area NDA1 and a second non-display area NDA2. The first non-display area NDA1 may be an area of the non-display area NDA which extends along a portion of the display area DA among areas of the non-display area NDA. The first non-display area NDA1 may be defined as an area in which the signal generating chip IC is disposed and which is between the display area DA and the signal generating chip IC. The second non-display area NDA2 may surround a remainder of the display area DA which excludes the portion of the display area DA along which the first non-display area NDA1 extends. A total planar area of the first non-display area NDA1 may be smaller than a total planar area of the second non-display area NDA2.

The fan-out line FOL of FIG. 1 may include a first fan-out line FOL1 and a second fan-out line FOL2. The first fan-out line FOL1 may be provided in plural including a plurality of first fan-out lines FOL1, and the second fan-out line FOL2 may be provided in plural including a plurality of second fan-out lines FOL2. The plurality of first fan-out lines FOL1 and the second fan-out line FOL2 alternate in a direction away from the curved outer edge of the display area DA.

Hereinafter, description may be based on one of the first fan-out lines FOL1 among the first fan-out lines FOL1. Similarly, the description may be based on one of the second fan-out lines FOL2 among the second fan-out lines FOL2.

The connection lines CL of FIG. 1 may include a first connection line CL1 and a second connection line CL2. The first connection line CL1 may be provided in plural including a plurality of first connection lines CL1, and the second connection line CL2 may be provided in plural including a plurality of second connection lines CL2. The plurality of first connection lines CL1 and the plurality of second connection lines CL2 alternate with each other in a direction away from the curved outer edge of the display area DA.

Hereinafter, the description may be based on one of the first connection lines CL1 among the first connection lines CL1. Similarly, the description may be based on one of the second connection lines CL2 among the second connection lines CL2.

The first fan-out line FOL1 and the second fan-out line FOL2 may be disposed in the first non-display area NDA1.

The first connection line CL1 may include a first portion CL1-1 disposed in the first non-display area NDA1 and a second portion CL1-2 disposed in the second non-display area NDA2. The first portion CL1-1 of the first connection line CL1 may overlap the first fan-out line FOL1, and the second portion CL1-2 of the first connection line CL1 may be a remaining portion of the first connection line CL1 excluding the first portion CL1-1.

Similarly, the second connection line CL2 may include a first portion CL2-1 disposed in the first non-display area NDA1 and a second portion CL2-2 disposed in the second non-display area NDA2. The first portion CL2-1 of the second connection line CL2 may overlap the second fan-out line FOL2, and the second portion CL2-2 of the second connection line CL2 may be a remaining portion of the second connection line CL2 excluding the first portion CL2-1.

The first connection line CL1 may be connected to the first fan-out line FOL1 at the first portion CL1-1 of the first connection line CL1. In an embodiment, for example, the first connection line CL1 may be connected to the first fan-out line FOL1 at a first end of the first connection line CL1, through a first contact hole CNT1. The first connection line CL1 may be connected to the demultiplexers DDC at a second end of the first connection line CL1. The second end is opposite to the first end. However, embodiments are not limited thereto. In an embodiment, the first connection line CL1 may not be directly connected to the demultiplexers DDC. That is, the first connection line CL1 may be connected to the demultiplexers DDC through another configuration.

Similarly, the second connection line CL2 may be connected to the second fan-out line FOL2 at the first portion CL2-1 of the second connection line CL2. In an embodiment, for example, the second connection line CL2 may be connected to the second fan-out line FOL2 at a first end of the second connection line CL2, through at least one contact hole (e.g., at least one among a second contact hole CNT2 and a third contact hole CNT3 of FIG. 6). The second connection line CL2 may be connected to the demultiplexers DDC at a second end of the second connection line CL2. The second end is opposite to the first end. However, embodiments are not limited thereto. In an embodiment, the second connection line CL2 may not be directly connected to the demultiplexers DDC. That is, the second connection line CL2 may be connected to the demultiplexers DDC through another configuration.

Referring to FIGS. 4 to 6, the display device 10 may include a substrate SUB. The substrate SUB may include glass, quartz, plastic, etc. In an embodiment, the substrate SUB may include plastic, and thus the display device 10 may have a flexible characteristic.

The substrate SUB may have a structure in which at least one of a lower film PI and at least one of a barrier layer BRR are stacked. In an embodiment, for example, the lower film PI may be formed using an organic material such as polyimide, and the barrier layer BRR may be formed using an inorganic material.

In an embodiment, for example, the lower film PI may include polyethylene terephthalate, polyethylene naphthalate, polyether ketone, polycarbonate, polyarylate, polyethersulfone, polyimide, polybenzoxazole, polybenzobisoxazole, polybenzoimidazole, polybenzothiazole, or combinations thereof.

The barrier layer BRR may reduce or effectively prevent diffusion of metal atoms or impurities from the substrate SUB to an active pattern which may be included in a transistor. The barrier layer BRR may include silicon oxide, silicon nitride, silicon oxynitride, aluminum oxide, tantalum oxide, hafnium oxide, zirconium oxide, titanium oxide, or a combination thereof. The barrier layer BRR may have a single layer or multilayer structure including the above materials.

A buffer layer BFR may be disposed on the substrate SUB. The buffer layer BFR may reduce or effectively prevent diffusion of metal atoms or impurities from the substrate SUB to the active pattern. The buffer layer BFR may include silicon oxide, silicon nitride, or silicon oxynitride, and may have a single layer or multilayer structure.

A first insulation layer GI1 may be disposed on the buffer layer BFR. The first insulation layer GI1 may include at least one inorganic insulating material. Examples of the inorganic insulating material may include silicon oxide, silicon nitride, silicon oxynitride, aluminum oxynitride, titanium oxide, or a combination thereof. The first insulation layer GI1 may have a single layer or multilayer structure including the above materials.

A first conductive layer may be disposed on the buffer layer BFR. The first conductive layer may include the first fan-out line FOL1. The first conductive layer may include a metal, an alloy, a conductive metal oxide, a transparent conductive material, etc.

In an embodiment, for example, the first fan-out line FOL1 may include a metal such as molybdenum (Mo). Molybdenum may have high chemical resistance, and properties of the metal may not change even at high temperatures. Accordingly, when the first fan-out line FOL1 includes molybdenum, the first fan-out line FOL1 may have high chemical resistance and high temperature stability.

A second insulation layer GI2 may cover the first conductive layer and be disposed on the first conductive layer. The second insulation layer GI2 may include an insulating material. Specifically, the second insulation layer GI2 may include silicon oxide, silicon nitride, or silicon oxynitride, and may have a single layer or multilayer structure.

A second conductive layer may be disposed on the second insulation layer GI2. The second conductive layer may include a second fan-out line FOL2. The second conductive layer may include a metal, an alloy, a conductive metal oxide, a transparent conductive material, etc.

In an embodiment, for example, the second fan-out line FOL2 may include a metal such as molybdenum (Mo), like the first fan-out line FOL1. When the second fan-out line FOL2 includes molybdenum, the second fan-out line FOL2 may have high chemical resistance and high temperature stability.

A third insulation layer ILD may cover the second conductive layer and may be disposed on the second insulation layer GI2. The third insulation layer ILD may include the insulating material. In an embodiment, for example, the third insulation layer ILD may include silicon oxide, silicon nitride, silicon oxynitride, aluminum oxide, or the like. The third insulation layer ILD may have a single layer or multilayer structure including the above materials.

A third conductive layer may be disposed on the third insulation layer ILD. The third conductive layer may include the first connection line CL1 and a connection pattern CP.

The connection pattern CP may be disposed on a same layer as the first connection line CL1 and may be spaced apart from the first connection line CL1. The connection pattern CP and the first connection line CL1 may be respective patterns of a same material layer, e.g., the third conductive layer, to be in a same layer as each other. The connection pattern CP may overlap the second fan-out line FOL2 and the second connection line CL2, and may connect the second fan-out line FOL2 and the second connection line CL2 which are in different material layers along a thickness direction of the display device 10, to each other.

The third conductive layer may include a metal, an alloy, a conductive metal oxide, a transparent conductive material, etc. In an embodiment, for example, the first connection line CL1 and the connection pattern CP may include a metal such as aluminum (Al), titanium (Ti), etc. The first connection line CL1 and the connection pattern CP may have a multilayer structure made of Ti—Al—Ti. Aluminum may have a relatively small resistivity and excellent conductivity. Accordingly, when the first connection line CL1 and the connection pattern CP include aluminum, the first connection line CL1 and the connection pattern CP may have low electrical resistance and high conductivity.

A fourth insulation layer VIA may cover the third conductive layer and may be disposed on the third insulation layer ILD. The fourth insulation layer VIA may include an organic insulating material. In an embodiment, for example, the fourth insulation layer VIA may include a photoresist, a polyacrylic resin, a polyimide resin, an acrylic resin, etc. The fourth insulation layer VIA may have a single layer or multilayer structure including the above materials.

A fourth conductive layer may be disposed on the fourth insulation layer VIA. The fourth conductive layer may include the second connection line CL2. The fourth conductive layer may include a metal, an alloy, a conductive metal oxide, a transparent conductive material, etc. In an embodiment, for example, the second connection line CL2 may include a metal such as aluminum (Al) or titanium (Ti). The second connection line CL2 may have a multilayer structure made of Ti—Al—Ti. Like the first connection line CL1, when the second connection line CL2 includes aluminum, the second connection line CL2 may have low electrical resistance and high conductivity.

In an embodiment, the first fan-out lines FOL1 and the second fan-out lines FOL2 may be alternately disposed in a plan view. That is, the first fan-out lines FOL1 and the second fan-out lines FOL2 may be disposed to be spaced apart from each other in a plan view. Also, the first fan-out lines FOL1 and the second fan-out lines FOL2 may be disposed in different layers from each other among material layers arranged along the thickness direction of the display device 10. As the first fan-out lines FOL1 and the second fan-out lines FOL2 are alternately disposed with each other and disposed in different layers, electrical signals flowing through each of the first fan-out lines FOL1 and the second fan-out lines FOL2 may not be affected by each other. Accordingly, a defect such as an electrical short may not occur between the first fan-out lines FOL1 and the second fan-out lines FOL2.

The first connection lines CL1 and the second connection lines CL2 may be alternately disposed in a plan view. That is, the first connection lines CL1 and the second connection lines CL2 may be disposed to be spaced apart from each other in a plan view in the non-display area NDA, respectively. Also, the first connection line CL1 and the second connection line CL2 may be disposed in different layers from each other among material layers arranged along the thickness direction of the display device 10. As the first connection lines CL1 and the second connection lines CL2 are alternately disposed in a plan view and disposed in different layers, electrical signals flowing through each of the first connection line CL1 and the second connection line CL2 may not be affected by each other. Accordingly, the defect such as an electrical short circuit may not occur between the first connection line CL1 and the second connection line CL2.

The first fan-out line FOL1 may be connected to the first connection line CL1 through (or at) the first contact hole CNT1. That is, the first fan-out line FOL1 may contact the first connection line CL1 through the first contact hole CNT1. Accordingly, a data signal DATA (of FIG. 3) may be provided from the first fan-out line FOL1 to the first connection line CL1.

The first contact hole CNT1 may be formed in the second insulation layer GI2 and the third insulation layer ILD. That is, the first contact hole CNT1 may be formed to extend through thicknesses of the second insulation layer GI2 and the third insulation layer ILD disposed between the first conductive layer and the third conductive layer. Although a number of the first contact hole CNT1 is three in FIG. 4, embodiments are not limited thereto. That is, the first fan-out line FOL1 may contact the first connection line CL1 at a plurality of locations (e.g., three locations in FIG. 4) according to the plurality of first contact holes CNT1 arranged along the respective conductive line (e.g., the first fan-out line FOL1 and/or the first connection line CL1). A first contact area CA1 may be defined including each of the respective contact holes at which the first fan-out line FOL1 contacts the first connection line CL1.

The second fan-out line FOL2 may be connected to the second connection line CL2 through (or at) a plurality of contact holes CNT2 and CNT3. Specifically, the second fan-out line FOL2 may be connected to the connection pattern CP through the second contact hole CNT2. The connection pattern CP disposed on the second fan-out line FOL2 may be connected to the second connection line CL2 through the third contact hole CNT3. That is, the second fan-out line FOL2 may be connected to the second connection line CL2 through the connection pattern CP. Accordingly, the data signal DATA may be provided from the second fan-out line FOL2 to the second connection line CL2.

The second contact hole CNT2 may be formed in the third insulation layer ILD. That is, the second contact hole CNT2 may be formed extending through the third insulation layer ILD disposed between the second conductive layer and the third conductive layer. The third contact hole CNT3 may be formed in the fourth insulation layer VIA. That is, the third contact hole CNT3 may be formed extending through the fourth insulation layer VIA disposed between the third conductive layer and the fourth conductive layer. Although the number of the second contact hole CNT2 is three and the number of the third contact hole CNT3 is two in FIG. 4, embodiments are not limited thereto. A second contact area CA2 may be defined including each of the respective contact holes at which the second fan-out line FOL2, the connection pattern CP and the second connection line CL2 respectively contact each other.

Referring to FIG. 4, the first contact area CA1 in which the first contact hole CNT1 is located and the second contact area CA2 in which the second contact hole CNT2 and the third contact hole CNT3 are located may be staggered from each other in a plan view.

In the plan view, each of the conductive lines may include a major dimension defining a length of a respective conductive line and a minor dimension defining a width of the respective conductive line. In an embodiment, for example, the first contact area CA1 and the second contact area CA2 may be staggered from each other in a zigzag pattern in a plan view. The first contact area CA1 and the second contact area CA2 may be staggered from each other in a zigzag pattern along lengths of the conductive lines. A separation distance d3 may be defined along the lengths of the conductive lines within the first non-display area NDA1. Accordingly, the separation distance d3 between the first connection line CL1 and the connection pattern CP disposed in a same layer as each other may be secured. Since the separation distance d3 between the first connection line CL1 and the connection pattern CP is secured, electrical signals flowing through each of the first connection line CL1 and the connection pattern CP may not be affected by each other. Accordingly, along widths of the conductive lines within the first non-display area NDA1, a distance between the first fan-out line FOL1 and the second fan-out line FOL2 adjacent in a plane and a distance between the first connection line CL1 and the second connection line CL2 may be further narrowed. Also, an overall planar area of the non-display area NDA may be reduced.

A resistivity value (e.g., electrical resistivity) of molybdenum included in the first fan-out line FOL1 and the second fan-out line FOL2 may be higher than a resistivity value of aluminum included in the first connection line CL1 and the second connection line CL2. Accordingly, the first connection line CL1 and the second connection line CL2 including aluminum may have a lower resistivity than the first fan-out line FOL1 and the second fan-out line FOL2 including molybdenum.

Specifically, the resistivity value of the first fan-out line FOL1 may be about 0.4 Ohm-meter ($\Omega \cdot m$), and the resistivity value of the second fan-out line FOL2 may be about 0.46 $\Omega \cdot m$. The resistivity value of each of the first connection line CL1 and the second connection line CL2 may be about 0.046 $\Omega \cdot m$. Accordingly, the resistivity value of the first fan-out line FOL1 may correspond to about 10 times the resistivity value of the first connection line CL1, and the resistivity value of the second fan-out line FOL2 may correspond to about 10 times the resistivity value of the second connection line CL2. Accordingly, electrical resistance due to the conductive signal lines disposed in the non-display area NDA of the display device 10 may be reduced.

In an embodiment, referring to the various resistivity values discussed above, the first connection line CL1 connects the display area DA to the first fan-out line FOL1 and has a second resistivity value less than a first resistivity value of the first fan-out line FOL1. Further, the second connection line CL2 is spaced apart from the first connection line CL1, connects the display area DA to the second fan-out line FOL2 and has a fourth resistivity value less than a third resistivity value of the second fan-out line FOL2.

In an embodiment, by connecting the first fan-out line FOL1 to the first connection line CL1 and the second fan-out line FOL2 to the second connection line CL2, the electrical resistivity of the conductive signal lines included in the display device 10 may be reduced. Specifically, in the display device 10 which is non-square, the demultiplexers DDC (of FIG. 2) and the scan circuits SDC (of FIG. 2) may be alternately disposed with each other along the arc direction DR3 within the non-display area NDA. A distance from the signal generating chip IC to the demultiplexers DDC may be relatively increased. Accordingly, lengths of conductive signal lines connecting the signal generating chip IC and the demultiplexers DDC may be relatively long, and thus the line resistance by the conductive signal lines may increase. In an embodiment, as the first connection line CL1 and the second connection line CL2 having relatively lower resistivity values are disposed in the second non-display area NDA2 further from a signal generator than the first non-display area NDA1 as compared to the first fan-out line FOL1 and the second fan-out line FOL1 having relatively higher resistivity values, the line resistance of the lines may be reduced. Accordingly, a sufficient scan-on time (SOT) may be secured, and image quality defects due to unevenness and crosstalk of the display device 10 may be improved.

As the first connection line CL1 and the second connection line CL2 having relatively lower resistivity values are disposed in the second non-display area NDA2 instead of the first fan-out line FOL1 and the second fan-out line FOL1 having relatively higher resistivity values, a minimum width of the lines may be reduced. Accordingly, the area of the non-display area NDA of the display device 10 may be reduced.

FIG. 7 is an enlarged plan view of a display device 11. FIG. 8 is a cross-sectional view taken along line of III-III' FIG. 7. FIG. 9 is a cross-sectional view taken along line IV-IV' of FIG. 7.

Referring to FIGS. 7 to 9, the first fan-out line FOL1 and the second fan-out line FOL2 may be disposed in the first non-display area NDA1.

The first connection line CL1 may include a first portion CL1-1 disposed in the first non-display area NDA1 and a second portion CL1-2 disposed in the second non-display area NDA2. The first portion CL1-1 of the first connection line CL1 may overlap the second fan-out line FOL2, and the second portion CL1-2 of the first connection line CL1 may be a portion excluding the first portion CL1-1 (e.g., remaining portion).

Similarly, the second connection line CL2 may include a first portion CL2-1 disposed in the first non-display area NDA1 and a second portion CL2-2 disposed in the second non-display area NDA2. The first portion CL2-1 of the second connection line CL2 may overlap the first fan-out line FOL1, and the second portion CL2-2 of the second connection line CL2 may be a portion excluding the first portion CL2-1.

The first connection line CL1 may be connected to the second fan-out line FOL2 at the first portion CL1-1 of the first connection line CL1. In an embodiment, for example, the first connection line CL1 may be connected to the second fan-out line FOL2 at a first end of the first connection line CL1, through one or more of the fourth contact hole CNT4. The first connection line CL1 may be connected to the demultiplexers DDC at a second end of the first connection line CL1. The second end of the first connection line CL1 is opposite to the first end of the first connection line CL1. However, embodiments are not limited thereto. In an embodiment, the first connection line CL1 may not be directly connected to the demultiplexers DDC. That is, the first connection line CL1 may be connected to the demultiplexers DDC through another configuration.

Similarly, the second connection line CL2 may be connected to the first fan-out line FOL1 at the first portion CL2-1 of the second connection line CL2. In an embodiment, for example, the second connection line CL2 may be connected to the first fan-out line FOL1 at a first end of the second connection line CL2, through one or more of a fifth contact hole CNT5 and one or more of a sixth contact hole CNT6. The second connection line CL2 may be connected to the demultiplexers DDC at a second end of the second connection line CL2. The second end of the second connection line CL2 is opposite to the first end of the second connection line CL2. However, embodiments are not limited thereto. In an embodiment, the second connection line CL2 may not be directly connected to the demultiplexers DDC. That is, the second connection line CL2 may be connected to the demultiplexers DDC through another configuration.

The connection pattern CP may be disposed on a same layer as the first connection line CL1 and may be spaced apart from the first connection line CL1. The connection pattern CP may overlap the first fan-out line FOL1 and the second connection line CL2, and may connect the first fan-out line FOL1 and the second connection line CL2 to each other.

The first fan-out line FOL1 and the second fan-out line FOL2 may include a metal such as molybdenum (Mo). Accordingly, when the first fan-out line FOL1 and the second fan-out line FOL2 include molybdenum, the first fan-out line FOL1 and the second fan-out line FOL2 may have high chemical resistance and high temperature stability.

Each of the first connection line CL1, the second connection line CL2, and the connection pattern CP may include a metal such as aluminum (Al) or titanium (Ti). Each of the first connection line CL1, the second connection line CL2, and the connection pattern CP may have a multilayer structure made of Ti—Al—Ti. Accordingly, when each of the first connection line CL1, the second connection line CL2, and the connection pattern CP includes aluminum, the first connection line CL1, the second connection line CL2, and the connection pattern CP each may have low electrical resistance and high conductivity.

In an embodiment, the first fan-out lines FOL1 and the second fan-out lines FOL2 may be alternately disposed in a plan view. That is, the first fan-out lines FOL1 and the second fan-out lines FOL2 may be disposed to be spaced apart from each other in a plan view. Also, the first fan-out lines FOL1 and the second fan-out lines FOL2 may be disposed on different layers. As first fan-out lines FOL1 and the second fan-out lines FOL2 are alternately disposed with each other and disposed on different layers, electrical signals flowing through each of the first fan-out lines FOL1 and the second fan-out lines FOL2 may not be affected by each other. Accordingly, a defect such as an electrical short may not occur between the first fan-out lines FOL1 and the second fan-out lines FOL2.

The first connection lines CL1 and the second connection lines CL2 may be alternately disposed in a plan view. That is, the first connection lines CL1 and the second connection lines CL2 may be disposed to be spaced apart from each other in a plan view. Also, the first connection lines CL1 and the second connection lines CL2 may be disposed on different layers. As the first connection lines CL1 and the second connection lines CL2 are alternately disposed in the non-display area NDA and disposed on different layers, electrical signals flowing through each of the first connection line CL1 and the second connection line CL2 may not be affected by each other. Accordingly, the defect such as the electrical short may not occur between the first connection line CL1 and the second connection line CL2.

The second fan-out line FOL2 may be connected to the first connection line CL1 through the fourth contact hole CNT4. That is, the second fan-out line FOL2 may contact the first connection line CL1 through the fourth contact hole CNT4. Accordingly, a data signal DATA (of FIG. 3) may be provided from the second fan-out line FOL2 to the first connection line CL1.

The fourth contact hole CNT4 may be formed in the third insulation layer ILD. That is, the fourth contact hole CNT4 may be formed through the third insulation layer ILD disposed between the second conductive layer and the third conductive layer. Although it is illustrated that the number of the fourth contact hole CNT4 is three in FIG. 7, embodiments are not limited thereto.

The first fan-out line FOL1 may be connected to the second connection line CL2 through the plurality of contact holes CNT5 and CNT6. Specifically, the first fan-out line FOL1 may be connected to the connection pattern CP through the fifth contact hole CNT5. The connection pattern CP disposed on the first fan-out line FOL1 may be connected to the second connection line CL2 through the sixth contact hole CNT6. That is, the first fan-out line FOL1 may be connected to the second connection line CL2 through the connection pattern CP. Accordingly, the data signal DATA may be provided from the first fan-out line FOL1 to the second connection line CL2.

The fifth contact hole CNT5 may be formed in the second insulation layer GI2 and the third insulation layer ILD. That is, the fifth contact hole CNT5 may be formed through the second insulation layer GI2 and the third insulation layer ILD disposed between the first conductive layer and the third conductive layer. The sixth contact hole CNT6 may be formed in the fourth insulation layer VIA. That is, the sixth contact hole CNT6 may be formed through the fourth insulation layer VIA disposed between the third conductive layer and the fourth conductive layer. Although it is illustrated that the number of the fifth contact hole CNT5 is three and the number of the sixth contact hole CNT6 is two in FIG. 7, the embodiments are not limited thereto.

Referring to FIG. 7, a third contact area CA3 in which the fourth contact hole CNT4 is located and a fourth contact area CA4 in which both the fifth contact hole CNT5 and the sixth contact hole CNT6 are located may be staggered from each other in a plan view. In an embodiment, for example, the third contact area CA3 and the fourth contact area CA4 may be staggered from each other in a zigzag pattern in a plan view. Accordingly, a separation distance d4 between the first connection line CL1 and the connection pattern CP disposed on a same layer may be secured. Since the separation distance d4 between the first connection line CL1 and the connection pattern CP is secured, electrical signals flowing through each of the first connection line CL1 and the connection pattern CP may not be affected by each other. Accordingly, a distance between the first fan-out line FOL1 and the second fan-out line FOL2 adjacent in a plane and a distance between the first connection line CL1 and the second connection line CL2 may be further narrowed, and an overall planar area of the non-display area NDA may be reduced.

The resistivity value of molybdenum included in the first fan-out line FOL1 and the second fan-out line FOL2 may be higher than the resistivity value of aluminum included in the first connection line CL1 and the second connection line CL2. Accordingly, each of the first connection line CL1 and the second connection line CL2 including aluminum may have a lower resistivity than the first fan-out line FOL1 and the second fan-out line FOL2 including molybdenum. The resistivity value of the first fan-out line FOL1 may be about 0.4 $\Omega \cdot$m, and the resistivity value of the second fan-out line FOL2 may be about 0.46 $\Omega \cdot$m. A resistivity value of each of the first connection line CL1 and the second connection line CL2 may be about 0.046 $\Omega \cdot$m. Accordingly, the resistivity value of the first fan-out line FOL1 may correspond to about 10 times the resistivity value of the second connection line CL2, and the resistivity value of the second fan-out line FOL2 may correspond to about 10 times the resistivity value of the first connection line CL1. Accordingly, resistance due to the conductive signal lines disposed in the non-display area NDA may be reduced.

In an embodiment, by connecting the first fan-out line FOL1 to the second connection line CL2 and connecting the second fan-out line FOL2 to the first connection line CL1, the overall resistivity values of the conductive lines included in the display device 11 may be reduced. Specifically, in the display device 11 which is non-square, the demultiplexers DDC (of FIG. 2) and the scan circuits SDC (of FIG. 2) may be alternately disposed with each other along the arc direction DR3 in the non-display area NDA. Accordingly, a distance from the signal generating chip IC to the demultiplexers DDC may be relatively increased. Accordingly, lengths of the conductive signal lines connecting the signal generating chip IC and the demultiplexers DDC to each other may be relatively long, and thus the line resistance by the conductive signal lines may increase. In an embodiment, as the first connection line CL1 and the second connection line CL2 having relatively lower resistivity values are disposed in the second non-display area NDA2 instead of the first fan-out line FOL1 and the second fan-out line FOL2 having relatively higher resistivity values, the line resistance of the conductive signal lines may be reduced. Accordingly, a sufficient scan-on time (SOT) may be secured, and image quality defects due to unevenness and crosstalk of the display device 11 may be improved.

In addition, as the first connection line CL1 and the second connection line CL2 having relatively lower resistivity values are disposed in the second non-display area NDA2 instead of the first fan-out line FOL1 and the second fan-out line FOL2 having relatively higher resistivity values, a minimum width of the lines may be reduced. Accordingly, the overall planar area of the non-display area NDA of the display device 11 may be reduced.

One or more embodiment of the display device 10 or the display device 11 may be applied to an electronic device included in a computer, a notebook, a mobile phone, a smartphone, a smart pad, a personal media player (PMP), a personal digital assistant (PDA), an MP3 player, or the like.

Although embodiments of the display device 10 and the display device 11 have been described with reference to the drawings, the illustrated embodiments are examples, and may be modified and changed by a person having ordinary knowledge in the relevant technical field without departing from the technical spirit described in the following claims.

What is claimed is:

1. An electronic device comprising:

a display device comprising a display area having a non-square shape and including a signal line, and a non-display area which is extended along an edge of the display area, wherein the non-display area includes:

a first driver connected to the display area by the signal line;

a second driver which is further from the display area than the first driver is from the display area and connected to the first driver;

a first non-display area; and a second non-display area closer to the first driver than the first non-display area is to the first driver; and a first connecting line which extends from the first driver to the second driver and connects the first driver to the second driver, within the non-display area, the first connecting line comprising:

a first fan-out line having a first resistivity value;

a first connection line which is connected to the first fan-out line and has a second resistivity value which is less than the first resistivity value of the first fan-out line; and the first connection line including:

a first portion in the first non-display area, and the first portion extending to the second non-display area to define a second portion in the second non-display area, wherein among the first fan-out line and the first connection line within the first connecting line extending from the first driver to the second driver within the non-display area, the first connection line is closer to the first driver than the first fan-out line is to the first driver, wherein the first connection line is connected to the first fan-out line through a first contact hole, and wherein among the first non-display area and the second non-display area of the non-display area, the first portion of the first connection line overlaps the first fan-out line within the first non-display area.

2. The electronic device of claim 1, wherein the first fan-out line includes molybdenum, and the first connection line includes aluminum and titanium.

3. The electronic device of claim 1, further comprising:

an insulation layer defining the first contact hole in the non-display area, and the first connection line connected to the first fan-out line at the first contact hole which is in the non-display area.

4. The electronic device of claim 1, wherein the non-display area further includes a second connecting line which extends from the first driver to the second driver and connects the first driver to the second driver, within the non-display area, the second connection line comprising:

a second fan-out line which is spaced apart from the first fan-out line and has a third resistivity value; and a second connection line which is connected to the second fan-out line, is spaced apart from the first connection line, and has a fourth resistivity value which is less than the third resistivity value of the second fan-out line, wherein among the second fan-out line and the second connection line of the second connecting line within the second connecting line extending from the first driver to the second driver, the second connection line is closer to the first driver than the second fan-out line is to the first driver.

5. The electronic device of claim 4, wherein the first fan-out line is provided in plural including a plurality of first fan-out lines, the second fan-out line is provided in plural including a plurality of second fan-out lines, and, the plurality of first fan-out lines and the plurality of second fan-out lines alternate with each other in a direction away from the edge of the display area.

6. The electronic device of claim 4, wherein the first connection line is provided in plural including a plurality of first connection the lines, second connection line is provided in plural including a plurality of second connection lines, and the plurality of first connection lines and the plurality of second connection lines alternate with each other in a direction away from the edge of the display area.

7. The electronic device of claim 4, wherein the second connecting line further comprises a connection pattern which is in a same layer as the first connection line, is spaced apart from the first connection line, and connects the second fan-out line and the second connection line to each other; and among the first non-display area and the second non-display area of the non-display area, the connection pattern is in the first non-display area.

8. The electronic device of claim 7, wherein among the first non-display area and the second non-display area of the non-display area, the first connection line is connected to the first fan-out line at the first contact hole in the first non-display area, the second fan-out line is connected to the connection pattern at a second contact hole in the first non-display area, and the connection pattern is connected to the second connection line at a third contact hole in the first non-display area.

9. The electronic device of claim 8, further comprising the second fan-out line, a first insulation layer, the first connection line and a second insulation layer in order toward the second connection line along a thickness direction of the display device, wherein the second contact hole extends through the first insulation layer, and the third contact hole extends through the second insulation layer.

10. The electronic device of claim 8, wherein the second connection line includes:

a first portion in the first non-display area, and the first portion extending to the second non-display area to define a second portion in the second non-display area.

11. The electronic device of claim 10, wherein among the first non-display area and the second non-display area of the non-display area, the first portion of the second connection line overlaps the second fan-out line within the first non-display area.

12. The electronic device of claim 8, wherein among the first non-display area and the second non-display area of the non-display area,

each of the first fan-out line and the second fan-out line has a length in the first non-display area, and the first contact hole and the second contact hole are spaced apart from each other and staggered in a zigzag pattern along the length of each of the first fan-out line and the second fan-out line.

13. The electronic device of claim 4, wherein the second driver includes a signal generating chip connected to the first connecting line and the second connecting line at the first fan-out line and the second fan-out line, respectively.

14. The electronic device of claim 4, wherein among layers arranged along a thickness direction of the display device:

the first fan-out line and the second fan-out line are in different layers, and the first connection line and the second connection line are in different layers.

15. The electronic device of claim 4, wherein the first driver which is in the non-display area includes a scan circuit and a demultiplexer arranged along the edge of the display area.

16. The electronic device of claim 15, wherein the demultiplexer is connected to the first connection line or the second connection line.

17. A display device comprising:

a display area having a non-square shape and including a signal line; and a non-display area extended along an edge of the display area, the non-display area including:

a first driver connected to the display area by the signal line;

a second driver which is further from the display area than the first driver is from the display area and connected to the first driver;

a first non-display area;

a second non-display area closer to the first driver than the first non-display area is to the first driver;

a first connecting line and a second connecting line each extending from the first driver to the second driver and connecting the first driver to the second driver, within the non-display area;

the first connecting line comprising:

a first fan-out line having a first resistivity value;

a first connection line which is connected to the first fan-out line and has a second resistivity value which is less than the first resistivity value of the first fan-out line; and the first connection line including:

a first portion in the first non-display area, and the first portion extending to the second non-display area to define a second portion in the second non-display area; and the second connecting line comprising:

a second fan-out line which is spaced apart from the first fan-out line and has a second resistivity value; and a second connection line which is spaced apart from the first connection line has a fourth resistivity value less than the first resistivity value, wherein within the non-display area:

among the first fan-out line and the first connection line within the first connecting line extending from the first driver to the second driver, the first connection line is closer to the first driver than the first fan-out line is to the first driver, among the second fan-out line and the second connection line within the second connecting line extending from the first driver to the second driver, the second connection line is closer to the first driver than the second fan-out line is to the first driver, the first connection line is connected to the first fan-out line through a first contact hole, and among the first non-display area and the second non-display area of the non-display area, the first portion of the first connection line overlaps the first fan-out line within the first non-display area.

18. The display device of claim 17, wherein the first fan-out line and the second fan-out line include molybdenum, and the first connection line and the second connection line include aluminum and titanium.

19. The display device of claim 17, wherein among layers arranged along a thickness direction of the display device:

the first fan-out line and the second fan-out line are in different layers, and the first connection line and the second connection line are in different layers, the first fan-out line is provided in plural including a plurality of first fan-out lines, the second fan-out line is provided in plural including a plurality of second fan-out lines, the plurality of first fan-out lines and the plurality of second fan-out lines alternate with each other in a direction away from the edge of the display area, the first connection line is provided in plural including a plurality of first connection lines, the second connection line is provided in plural including a plurality of second connection lines, and the plurality of first connection lines and the plurality of second connection lines alternate with each other in the direction away from the edge of the display area.

20. The display device of claim 17, further comprising:

an insulation layer between the second fan-out line and the first connection line and defining the first contact hole in the non-display area, and the first connection line connected to the second fan-out line at the first contact hole.

21. The display device of claim 17, wherein the first connecting line further comprises a connection pattern which is in a same layer as the first connection line, is spaced apart from the first connection line, and connects the first fan-out line and the second connection line to each other; and among the first non-display area and the second non-display area of the non-display area, the connection pattern is in the first non-display area.

22. The display device of claim 21, wherein among the first non-display area and the second non-display area of the non-display area, the first fan-out line and the connection pattern are connected to each other at a second contact hole in the first non-display area, and the connection pattern and the second connection line are connected to each other at a third contact hole in the first non-display area.

23. The display device of claim 22, further comprising the first fan-out line, a first insulation layer, the second fan-out line, a second insulation layer, the first connection line, and a third insulation layer in order toward the second connection line along a thickness direction of the display device.

24. The display device of claim 23, wherein the second contact hole extends through the first insulation layer and the second insulation layer, and the third contact hole extends through the third insulation layer.

* * * * *